United States Patent
Lee et al.

(10) Patent No.: US 7,056,872 B2
(45) Date of Patent: Jun. 6, 2006

(54) SOLUTION COMPOSITION FOR REMOVING A REMAINING PHOTORESIST RESIN

(75) Inventors: Geun Su Lee, Kyoungki-do (KR); Jae Chang Chung, Kyoungki-Do (KR); Ki Soo Shin, Kyoungki-do (KR); Kee Joon Oh, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 307 days.

(21) Appl. No.: 10/252,467

(22) Filed: Sep. 23, 2002

(65) Prior Publication Data

US 2003/0060382 A1    Mar. 27, 2003

(30) Foreign Application Priority Data

Sep. 21, 2001    (KR) .............................. 2001-58602

(51) Int. Cl.
*C23G 1/02*    (2006.01)
(52) U.S. Cl. ..................... 510/175; 510/176; 510/254; 510/255; 510/499; 134/2; 134/3; 438/692
(58) Field of Classification Search ................ 510/175, 510/176, 499, 255, 245, 254; 134/2; 252/79.1, 252/79.2, 79.3; 438/692, 693
See application file for complete search history.

(56) References Cited

U.S. PATENT DOCUMENTS

| | | | | |
|---|---|---|---|---|
| 3,919,100 A | * | 11/1975 | Brindisi et al. | 252/79.1 |
| 5,981,454 A | * | 11/1999 | Small | 510/175 |
| 6,534,458 B1 | * | 3/2003 | Kakizawa et al. | 510/175 |
| 6,752,878 B1 | * | 6/2004 | Montano et al. | 148/243 |

FOREIGN PATENT DOCUMENTS

KR    1020010067436 A    7/2001

* cited by examiner

*Primary Examiner*—Gregory Webb
(74) *Attorney, Agent, or Firm*—Marshall, Gerstein & Borun LLP

(57) ABSTRACT

Cleaning solutions for removing photoresist resins remaining on the underlying layer patterns formed by photolithography process using the photoresist patterns as etching mask. The cleaning solution for removing photoresist comprises $H_2O$ as solvent, amine compounds, hydrazine hydrate, transition metal-removing material and alkali metal-removing material. Photoresist coated on the top portion of underlying layers can be rapidly and effectively removed by the disclosed cleaning solution. In addition, the cleaning solution is environment-friendly because $H_2O$ is used as the solvent, and has little effect on metal layers when underlying layers are formed of metals.

10 Claims, 3 Drawing Sheets

SOLUTION COMPOSITION FOR REMOVING A REMAINING PHOTORESIST RESIN

BACKGROUND

1. Technical Field

A cleaning solution is disclosed for removing photoresist resins remaining on underlying layer patterns formed by photolithography process using the photoresist patterns as etching mask.

2. Description of the Related Art

Conventional cleaning solutions to remove photoresist remaining on the top portion of an underlying layer are generally organic solvent including amine ($-NH_2$) compounds.

However, conventional cleaning solutions for removing photoresist are environmentally harmful because they include excessive amounts of amine compounds and rely upon organic solvents. Conventional cleaning solutions also have a problem in that they are expensive.

Mixed solutions of $H_2O_2/H_2SO_4/H_2O$ have been also used as conventional cleaning solutions for removing photoresists. However, there is a problem in that the mixed solution erodes metal, and therefore, an underlying layer pattern is deformed when the underlying layer is metal.

FIG. 1 is a SEM photograph of a formed aluminum pattern after cleaning the remaining photoresist on the aluminum pattern using a conventional mixed cleaning solution of $H_2O_2/H_2SO_4/H_2O$. As shown in FIG. 1, the lateral surface of the Al pattern is severely damaged when the photoresist remaining on the Al pattern is cleaned with the mixed solution of $H_2O_2/H_2SO_4/H_2O$.

FIG. 2 is a SEM photograph of a formed tungsten pattern after cleaning the remaining photoresist on the tungsten pattern using a conventional mixed cleaning solution of $H_2O_2/H_2SO_4/H_2O$. As shown in FIG. 2, the lateral surface of the W pattern is severely damaged when the photoresist remaining on the W pattern is cleaned with the mixed solution of $H_2O_2/H_2SO_4/H_2O$.

SUMMARY OF THE DISCLOSURE

A cleaning solution for removing photoresist is disclosed which comprises water ($H_2O$) as the main solvent and amine compounds.

A method for forming an underlying layer pattern of a semiconductor device is disclosed which uses the disclosed cleaning solution for removing photoresist material.

DETAILED DESCRIPTION OF THE PRESENTLY PREFERRED EMBODIMENTS

Figure 1:
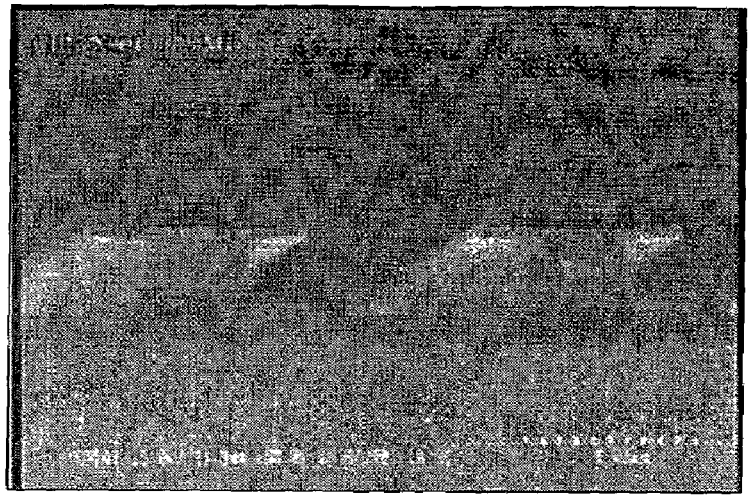
FIG. 1 is a SEM photograph of a resultant pattern after cleaning a remaining photoresist on the aluminum pattern using a conventional cleaning solution.
Figure 2:
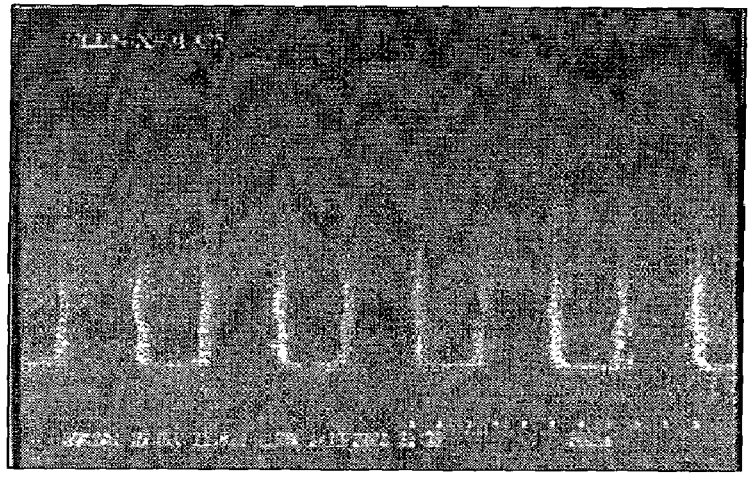
FIG. 2 is a SEM photograph of a resultant pattern after cleaning a remaining photoresist on the tungsten pattern using a conventional cleaning solution.

A disclosed cleaning solution for removing photoresist materials comprises: $H_2O$, amine compounds and optionally one or more of hydrazine hydrate, transition metal-removing material and alkali metal-removing material.

The $H_2O$, the main solvent is preferably distilled water.

The amine compounds dissolve the photoresist material. It is preferable that the amine compounds are selected from the group consisting of $NH_2(CH_2)_nOH$ (wherein, n is an integer from 0 to 10), $N(C_mH_{2m+1})_3$ (wherein, m is an integer from 1 to 10), $N(C_lH_{2l}OH)_3$ (wherein, l is an integer from 1 to 10), $NH_4OH$, $NH_4Cl$, $NH_4F$ and mixtures thereof, and the amine compounds are present in an amount ranging from about 1 to about 50 parts by weight, preferably from about 10 to about 30 parts by weight, and more preferably from about 15 to about 25 parts by weight to 100 parts by weight of the $H_2O$.

When the amount of the amine compounds is less than 1 part by weight, it is difficult to remove photoresist, while when it is more than 50 parts by weight, it has cost problem.

The hydrazine hydrate $NH_2NH_2 \cdot xH_2O$ prevents oxidation of metal, when the underlying layer is formed of metal such as aluminum and tungsten. It is preferable that the hydrazine hydrate is present in an amount ranging from about 0.01 to about 20 parts by weight to 100 parts by weight of the $H_2O$. However, when the underlying layer is formed of non-metal, the cleaning solution need not comprise the hydrazine hydrate.

The transition metal-removing material removes particles of transition metal existing on the underlying layer surface or in the photoresist. It is preferable that the transition metal-removing material is selected from the group consisting of ethylenenediaminetetraacectic acid (EDTA), 2,2'-dipyridyl, 2,2'-dipyridylamine, 1,4,8,12-tetraazacyclopentadecane, 1,4,8,11-tetraazacyclotetradecane, 1,4,8,11-tetraazacyclotetradecane-5,7-dione, 1,4,8,11-tetraazacyclotetradecane-1,4,8,11-tetraacetic acid and mixtures thereof, and the transition metal-removing material is present in an amount ranging from about 0.01 to about 10 parts by weight to 100 parts by weight of the $H_2O$.

The alkali metal-removing material removes particles of alkali metal existing on the underlying layer surface or in the photoresist. It is preferable that the alkali metal-removing material is selected from the group consisting of 15-crown-5, 18-crown-6, 1-aza-12-crown-4, 1-aza-15-crown-5, 1-aza-18-crown-6, polyethylene oxide, ethylene glycol, diethylene glycol, triethylen glycol, tetraethylene glycol, catechol and mixtures thereof, and the alkali metal-removing material is present in an amount ranging from about 0.01 to about 10 parts by weight to 100 parts by weight of the $H_2O$.

The cleaning solution preferably comprises the amine compounds, the hydrazine hydrate, the transition metal-removing material and the alkali metal-removing material in proportion of 15:25 parts by weight: 0.1:5 parts by weight: 0.1:5 parts by weight: 0.01:5 parts by weight to 100 parts by weight of the $H_2O$.

There is also provided a method of forming an underlying layer pattern of a semiconductor device, comprising: forming an underlying layer on a wafer; forming a photoresist pattern on the top portion of the underlying layer using a photolithography process; forming an underlying layer pattern by etching the underlying layer using the photoresist pattern as etching mask; and cleaning the resultant using the disclosed cleaning solution to remove photoresist remaining on the underlying layer pattern.

Here, the underlying layer may be a metal layer, an insulating layer or a conductive layer.

The disclosed cleaning solution for removing photoresist will now be described in more details referring to examples below, when are not intended to be limiting.

EXAMPLE 1

Preparation of Cleaning Solution for Removing Photoresist (1)

Distilled water (1L), 28 wt % of $NH_4OH$ aqueous solution (50 ml), 50 wt % of $NH_2OH$ aqueous solution (10 ml), $N(C_2H_4OH)_3$ (100 ml), $NH_2NH_2.H_2O$ (1 g), EDTA (0.1 g), 18-crown-6 (0.01 g) and polyethylene oxide having weight average molecular weight of 100,000 (0.1 g) were stirred at room temperature for 10 minutes. The resulting mixture was filtered through 0.2 μm filter to obtain cleaning solution for removing photoresist.

EXAMPLE 2

Preparation of Cleaning Solution for Removing Photoresist (2)

Distilled water (1L), 28 wt % of $NH_4OH$ aqueous solution (40 ml), 50 wt % of $NH_2OH$ aqueous solution (40 ml), $N(CH_2OH)_3$ (150 ml), $NH_2NH_2.H_2O$ (1 g), 1,4,8,11-tetraazacyclotetradecane-1,4,8,11-tetraacetic acid (0.01 g), diethylene glycol (1 g) and polyethylene oxide having weight average molecular weight of 100,000 (0.1 g) were stirred at room temperature for 10 minutes. The resulting mixture was filtered through 0.2 μm filter to obtain cleaning solution for removing photoresist.

EXAMPLE 3

Preparation of Cleaning Solution for Removing Photoresist (3)

Distilled water (1L), 28 wt % of $NH_4OH$ aqueous solution (40 ml), 50 wt % of $NH_2OH$ aqueous solution (40 ml), $N(C_2H_4OH)_3$ (200 ml), $N(C_8H_{17})_3$ (10 ml), $NH_2NH_2.H_2O$ (1 g), 1,4,8,11-tetraazacyclotetradecane-1,4,8,11-tetraacetic acid (0.01 g), diethylene glycol (1 g) and polyethylene oxide having weight average molecular weight of 100,000 (0.1 g) were stirred at room temperature for 10 minutes. The resulting mixture was filtered through 0.2 μm filter to obtain cleaning solution for removing photoresist.

EXAMPLE 4

Removal of Photoresist Using the Cleaning Solution (1)

After a wafer coated with KrF photoresist, SE430S produced by Shin-Etsu Co. in Japan at a thickness of 5000 Å was set up in the cleaning solution prepared in Example 1, ⅓ of the wafer and the photoresist was soaked in the cleaning solution for 10 minutes. Then, thickness of the soaked and unsoaked portions was compared. As a result, the soaked portion had the thickness of 3500 Å reduced by 1500 Å. The soaked portion of the photoresist was removed from the wafer and floated in the solution.

EXAMPLE 5

Removal of Photoresist Using the Cleaning Solution (2)

The procedure of Example 1 was repeated but using cleaning solution prepared in Example 2 instead of Example 1. As a result, the soaked portion had the thickness of 3100 Å reduced by 1900 Å. The soaked portion of the photoresist was removed from the wafer and floated in the solution.

EXAMPLE 6

Removal of Photoresist Using the Cleaning Solution (3)

The procedure of Example 1 was repeated but using the cleaning solution prepared in Example 3 instead of Example 1. As a result, the soaked portion had the thickness of 2600 Å reduced by 2400 Å. There was no floating photoresist.

Referring to results of Examples 4 to 6, while the soaked portion of photoresist was removed from the wafer and floated in Examples 4 and 5, there was no floating photoresist in Example 6. This result of Example 6 shows that photoresist resin which was removed from the wafer was dissolved in hydrophobic amine because the excessive amount of hydrophobic amine such as $N(C_2H_4)_3$ or $N(C_8H_{17})_3$ was used.

EXAMPLE 7

Removal of Photoresist Remaining on Aluminum Pattern Using the Cleaning Solution After an aluminum layer was formed on a wafer 10 according to a conventional semiconductor process, photoresist was coated on the top portion of the aluminum layer. Then, a photoresist pattern was formed using a photolithography process.

Figure 3:
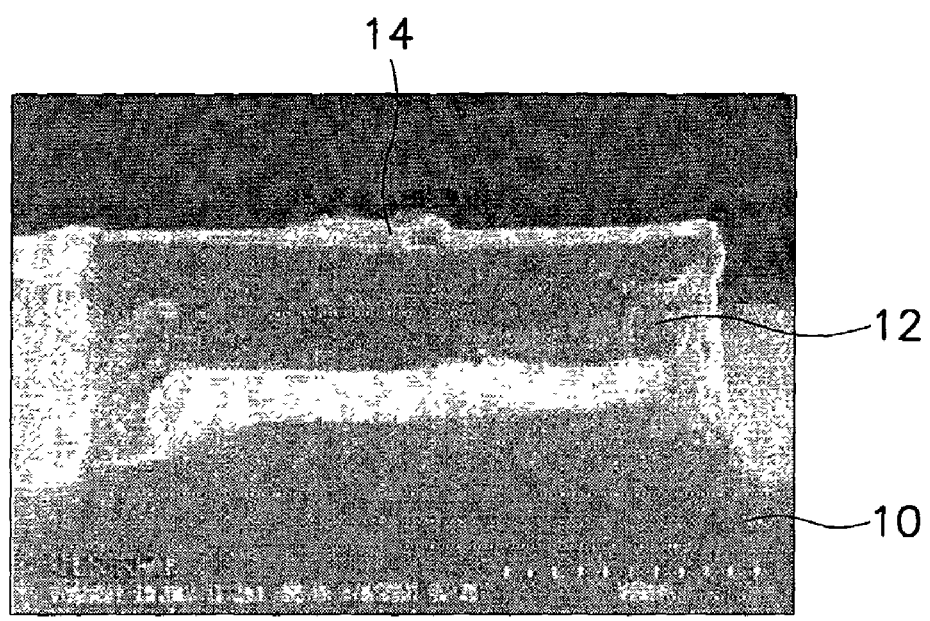
FIG. 3 is a SEM photograph of an aluminum pattern.

Thereafter, an aluminum pattern 12 was obtained by etching the aluminum layer using the photoresist pattern as etching mask, and a photoresist pattern was removed. Here, it was shown that photoresist 14 remained on the top portion of the aluminum pattern 12 (see FIG. 3).

Figure 4A:
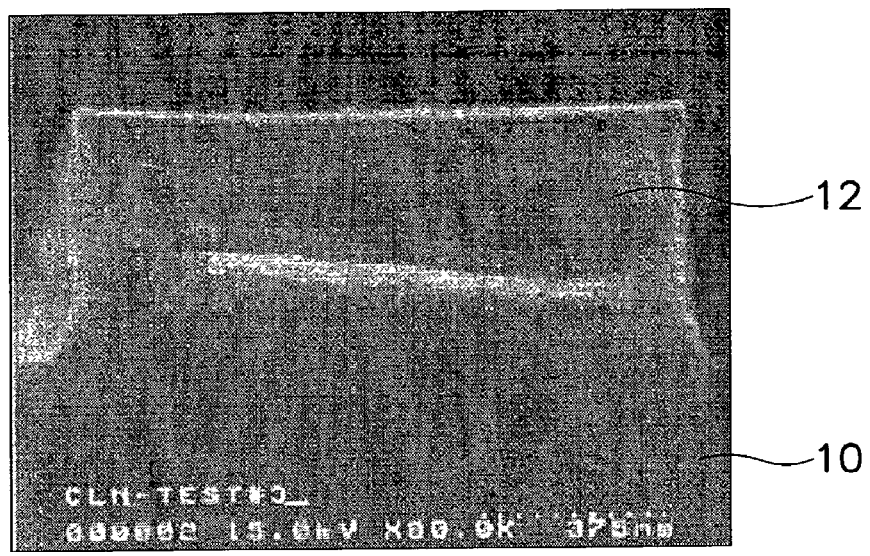
FIG. 4a is a SEM photograph of an aluminum pattern after cleaning the remaining photoresist of FIG. 3 using a disclosed cleaning solution.
Figure 4B:
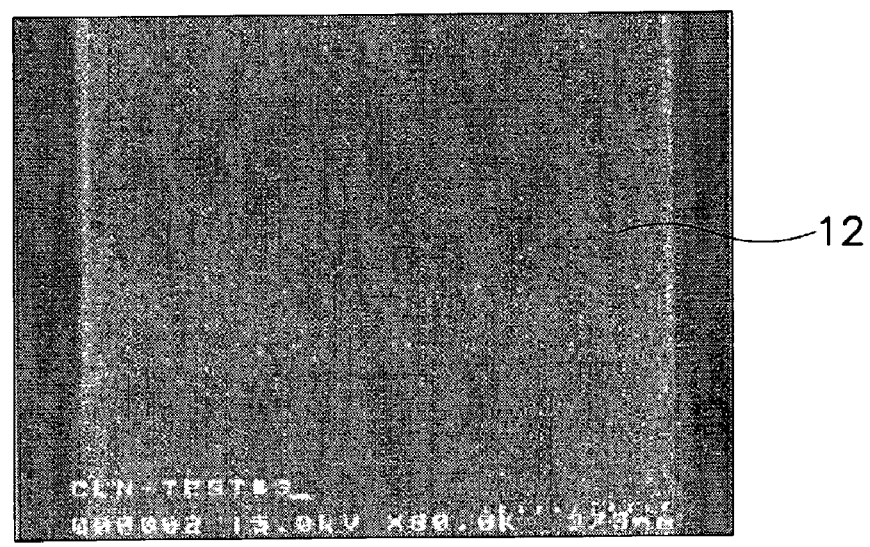
FIG. 4b is a SEM photograph illustrating an aluminum pattern after cleaning the remaining photoresist of FIG. 3 using a disclosed cleaning solution.

The above resultant was soaked in the cleaning solution prepared in Example 3 at room temperature for 5 minutes. Then, the resultant was cleaned with distilled water. Here, it was shown that the remaining photoresist 14 was removed and the aluminum pattern 12 was scarcely damaged by the cleaning solution (see FIGS. 4a and 4b).

As discussed earlier, cleaning solution for removing photoresist including $H_2O$ as main solvent, amine compounds and optionally one or more of hydrazine hydrate, transition metal-removing material and alkali metal-removing material according to this disclosure can rapidly and effectively remove photoresist coated on the top portion of an underlying layer on the wafer, have little effect on metal layers when an underlying layer is formed of metal and be environmental friendlier alternative to currently available cleaning solutions.

What is claimed is:

1. A cleaning solution for removing photoresist material consisting essentially of $H_2O$, amine compounds in an amount ranging from 1 to 50 parts by weight to 100 parts by weight of the $H_2O$, hydrazine hydrate in an amount ranging from 0.01 to 20 parts by weight to 100 parts by weight of the $H_2O$, transition metal-removing material in an amount ranging from 0.01 to 10 parts by weight to 100 parts by weight of the H₂O, and alkali metal-removing material in an amount ranging from about 0.01 to about 10 parts by weight by weight to 100 parts by weight of the H₂O.

2. The cleaning solution according to claim 1, the amine compounds are present in an amount ranging from about 10 to about 30 parts by weight to 100 parts by weight of the H₂O.

3. The cleaning solution according to claim 2, the amine compounds are present in an amount ranging from about 15 to about 25 parts by weight to 100 parts by weight of the H₂O.

4. The cleaning solution according to claim 1, wherein the amine compounds are selected from the group consisting of $NH_2(CH_2)_nOH$ (wherein, n is an integer from 0 to 10), $N(C_mH_{2m+1})_3$ (wherein, m is an integer from 1 to 10), $N(C_lH_{2l}OH)_3$ (wherein, l is an integer from 1 to 10), $NH_4OH$, $NH_4C$, $NH_4F$ and mixtures thereof.

5. The cleaning solution according to claim 1, wherein the transition metal-removing material is selected from the group consisting of ethylenediaminetetraacectic acid (EDTA), 2,2'-dipyridyl, 2,2'-dipyridylamine, 1,4,8,12-tetraazacyclopentadecane, 1,4,8,11-tetraazacyclotetradecane, 1,4,8,11-tetraazacyclotetradecane-5,7-dione, 1,4,8,11-tetraazacyclotetradecane-1,4,8,11-tetraacetic acid and mixtures thereof.

6. The cleaning solution according to claim 1, wherein the alkali metal-removing material is selected from the group consisting of 15-crown-5, 18-crown-6, 1-aza-12-crown-4, 1-aza-15-crown-5, 1-aza-18-crown-6, polyethylene oxide, ethylene glycol, diethylene glycol, triethylen glycol, tetraethylene glycol, catechol and mixtures thereof.

7. The cleaning solution according to claim 1, wherein the solution comprises amine compounds, hydrazine hydrate, transition metal-removing material and alkali metal-removing material in proportion of 15~25 parts by weight: 0.185 parts by weight: 0.1~5 parts by weight: 0.01~5 parts by weight to 100 parts by weight of the H₂O.

8. The cleaning solution according to claim 1, wherein the solution comprises mixture of $NH_4OH$, $NH_2OH$ and $N(C_2H_4OH)_3$ as the amine compounds, EDTA as the transition metal-removing material, and mixture of 18-crown-6 and polyethylene oxide as alkali metal-removing material.

9. The cleaning solution according to claim 1, wherein the solution comprises mixture of $NH_4OH$, $NH_2OH$ and $N(C_2H_4OH)_3$ as the amine compounds, 1,4,8,11-tetraazacyclotetradecane-1,4,8,11-tetraacetic acid as the transition metal-removing material, and mixture of diethylene glycol and polyethylene oxide as alkali metal-removing material.

10. The cleaning solution according to claim 1, wherein the solution comprises mixture of $NH_4OH$, $NH_2OH$, $N(C_2H_4OH)_3$ and $N(C_8H_{17})_3$ as the amine compounds, 1,4,8,11-tetraazacyclotetradecane-1,4,8,11-tetraacetic acid as the transition metal-removing material, and mixture of diethylene glycol and polyethylene oxide as alkali metal-removing material.

* * * * *